US010826165B1

(12) United States Patent
Deju et al.

(10) Patent No.: US 10,826,165 B1
(45) Date of Patent: Nov. 3, 2020

(54) SATELLITE SYSTEM HAVING RADIO FREQUENCY ASSEMBLY WITH SIGNAL COUPLING PIN AND ASSOCIATED METHODS

(71) Applicant: EAGLE TECHNOLOGY, LLC, Melbourne, FL (US)

(72) Inventors: Hector Deju, Indialantic, FL (US); Stephen Rego, Melbourne, FL (US); Joey D. Sartin, Palm Bay, FL (US); Daniel C. Lizana, West Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 16/516,324

(22) Filed: Jul. 19, 2019

(51) Int. Cl.
*H01Q 1/28* (2006.01)
*H01Q 13/02* (2006.01)
*H01Q 19/10* (2006.01)
*H05K 5/06* (2006.01)
*H03F 3/19* (2006.01)

(52) U.S. Cl.
CPC .............. *H01Q 1/288* (2013.01); *H01Q 13/02* (2013.01); *H01Q 19/10* (2013.01); *H03F 3/19* (2013.01); *H05K 5/069* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | |
|---|---|---|
| 4,550,296 A | 10/1985 | Ehrlinger et al. |
| 5,045,820 A | 9/1991 | Leicht et al. |
| 5,202,648 A | 4/1993 | McCandless |
| 5,376,901 A | 12/1994 | Chan et al. |
| 5,793,263 A | 8/1998 | Pozar |
| 5,808,519 A | 9/1998 | Gotoh et al. |
| 5,912,598 A | 6/1999 | Stones et al. |
| 5,982,250 A | 11/1999 | Hung et al. |
| 6,002,305 A | 12/1999 | Sanford et al. |

(Continued)

FOREIGN PATENT DOCUMENTS

| | | |
|---|---|---|
| EP | 1276169 | 1/2003 |
| WO | 1996027913 | 9/1996 |

OTHER PUBLICATIONS

Schmuckle et al., "A 30-GHz Waveguide-to-Microstrip-Transition", IEEE MTT-S International Microwave Symposium Digest, Honolulu, Jul. 2007, pp. 1169-1172.

(Continued)

*Primary Examiner* — Jany Richardson
(74) *Attorney, Agent, or Firm* — Allen, Dyer, Doppelt + Gilchrist, P.A.

(57) ABSTRACT

A satellite system may include a reflector and a mast extending outwardly from the reflector. A radio frequency (RF) assembly may be carried by a distal end of the mast and include a conductive waveguide body having an RF cavity therein coupled with the reflector and a pin-receiving opening therein. An RF circuit module may include a housing carried by the conductive waveguide body, RF circuitry contained within the housing, and a signal coupling pin coupled to the RF circuitry and extending through the pin-receiving opening into the RF cavity.

20 Claims, 12 Drawing Sheets

(56) References Cited

U.S. PATENT DOCUMENTS

| | | | |
|---|---|---|---|
| 6,201,453 B1 | 3/2001 | Chan et al. | |
| 6,486,748 B1 | 11/2002 | Stones et al. | |
| 6,707,348 B2 | 3/2004 | Ammar | |
| 6,815,739 B2 | 11/2004 | Huff et al. | |
| 6,967,542 B2 | 11/2005 | Weinstein | |
| 6,967,543 B2 | 11/2005 | Ammar | |
| 8,552,813 B2 | 10/2013 | Gritters et al. | |
| 9,742,069 B1* | 8/2017 | Hollenbeck | H01Q 19/13 |
| 10,418,712 B1* | 9/2019 | Henderson | H01Q 15/161 |
| 2010/0149061 A1* | 6/2010 | Haziza | H01Q 13/0233 |
| | | | 343/779 |
| 2014/0152492 A1* | 6/2014 | Zimmerman | H01Q 1/08 |
| | | | 342/352 |
| 2015/0061789 A1 | 3/2015 | Tanc et al. | |

OTHER PUBLICATIONS

Sun et al., "A Double Waveguide Frequency Bands Waveguide-to-Microstrip Transition", IEEE 2014 3rd Asia-Pacific Conference on Antennas and Propagation, Jul. 26-29, 2014, pp. 1-4.

Vidhi et al., "Hermetically Sealed Aperture Coupled Ka-Band Waveguide-to-Microstrip Transition for Space Applications", International Journal for Innovative Research in Science & Technology, vol. 2, Issue 09, Feb. 2016, pp. 146-150.

Cirone et al., "Packaging Solutions in Space MCMs and MHIC's", 1998 28th European Microwave Conference, Amsterdam, Oct. 5-9, 1998, pp. 662-667.

Peter Uhlig, "LTCC Technology for Planar Microwave Antenna", Doctoral Dissertation, Nov. 2018, pp. 1-139.

Lehtonen et al., "Microwave Multichip Modules", Johns Hopkins APL Technical Digest, vol. 15, No. 1, 1994, pp. 48-56.

\* cited by examiner

SATELLITE SYSTEM HAVING RADIO FREQUENCY ASSEMBLY WITH SIGNAL COUPLING PIN AND ASSOCIATED METHODS

FIELD OF THE INVENTION

The present invention relates to the field of satellite systems, and more particularly, to a satellite system having a radio frequency (RF) assembly and related methods.

BACKGROUND OF THE INVENTION

Small satellites have limited space to store electronics and an antenna, which becomes technically challenging when the electronics and associated components include radio frequency (RF) assemblies operating with a reflector and mast extending outwardly from the reflector. These components may desirably be compact when an antenna and any electronics operate at the L-band and S-band frequencies and at higher frequencies up to 20 GHz. For example, an antenna that includes a small reflector and mast operable in the Ka-band may have size constraints that make it difficult to incorporate amplifiers and other components, since the antenna and its associated reflector and mast are typically reduced in size. In some designs, it may be desirable to amplify RF signals at or close to the antenna, so that the amplifiers and associated components are to be incorporated into the smaller confined spaces associated with a reflector and mast. This problem becomes even more challenging when small satellites are built as CubeSat platforms, which are becoming more commonplace as miniaturized satellites made up of multiple units with one unit being about 10 cm by 10 cm by 10 cm or roughly 4 inches cubed. CubeSats are advantageous for smaller satellites because they are designed to use commercial off-the-shelf (COTS) components for their major circuits and can be implemented for custom satellite operation.

In most practical small satellite applications, a number of units are combined together to form a CubeSat platform as a small satellite that is typically intended for Low Earth Orbit (LEO) and performs scientific research and explores new space technologies. CubeSats are advantageous because their use as block units to build small satellites shortens the satellite development cycle, permits greater diversity in satellite design since each small satellite can be designed for a specific function, and reduces the overall cost of satellite deployment. CubeSats and similar small satellites often are suitable for launch with multiple small satellites per payload, thus using the excess capacity of larger launch vehicles and reducing the risk to the rest of the launch vehicle and other payloads.

Typical CubeSat satellite platforms are formed from multiple, individual units combined together and include a 6U design of about 4×8×12 inches or a 12U design of about 8×8×12 inches. CubeSats can be propelled by cold gas, chemical promotion, electric propulsion, or solar sails. Most CubeSats and similar small satellites have internal batteries for power, which preferably include solar cells.

Many Low Earth Orbit (LEO) small satellites, such as CubeSats, use antennas to operate in the UHF and L-band to S-band, and in the more rare deep space applications to operate in the X-band and Ka-band. These higher frequency bands allow the use of smaller antennae due to the higher frequencies, but the design constraints of small satellites, such as CubeSats, and associated smaller antenna with their smaller reflectors and masts, may make it difficult to implement workable RF assemblies with sufficient amplification at the reflector and mast to ensure there is sufficient RF signal power that reaches any electronics and RF signal processing circuits in the CubeSat.

SUMMARY OF THE INVENTION

In general, a satellite system may include a reflector and a mast extending outwardly from the reflector. A radio frequency (RF) assembly may be carried by a distal end of the mast. The RF assembly may include a conductive waveguide body having an RF cavity therein coupled with the reflector, and having a pin-receiving opening therein. An RF circuit module may include a housing carried by the conductive waveguide body, RF circuitry contained within the housing, and a signal coupling pin coupled to the RF circuitry and extending through the pin-receiving opening into the RF cavity.

The housing may comprise a hermetically sealed housing, and the RF circuitry may comprise an RF signal amplifier, for example, an integrated circuit Low Noise Amplifier (LNA). In some embodiments, the RF assembly may comprise an RF cable connector carried by the conductive waveguide body and coupled to the RF circuitry. The mast may have a passageway therein and a cable may be coupled to the RF cable connector and extend through the passageway. A subreflector may be carried by a distal end of the mast and aligned between the reflector and the RF assembly. A horn may be coupled to the conductive waveguide body and directed toward the subreflector.

Another aspect is directed to a method for making a radio frequency (RF) assembly for a satellite system that includes a reflector. The method may comprise forming a conductive waveguide body having an RF cavity therein to be coupled with the reflector, and having a pin-receiving opening therein. The method may include coupling an RF circuit module to the conductive waveguide body, the RF circuit module comprising a housing carried by the conductive waveguide body and RF circuitry contained within the housing. A signal coupling pin may be coupled to the RF circuitry and may extend through the pin-receiving opening into the RF cavity.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout, and prime notation is used to indicate similar elements in different embodiments.

Figure 1:
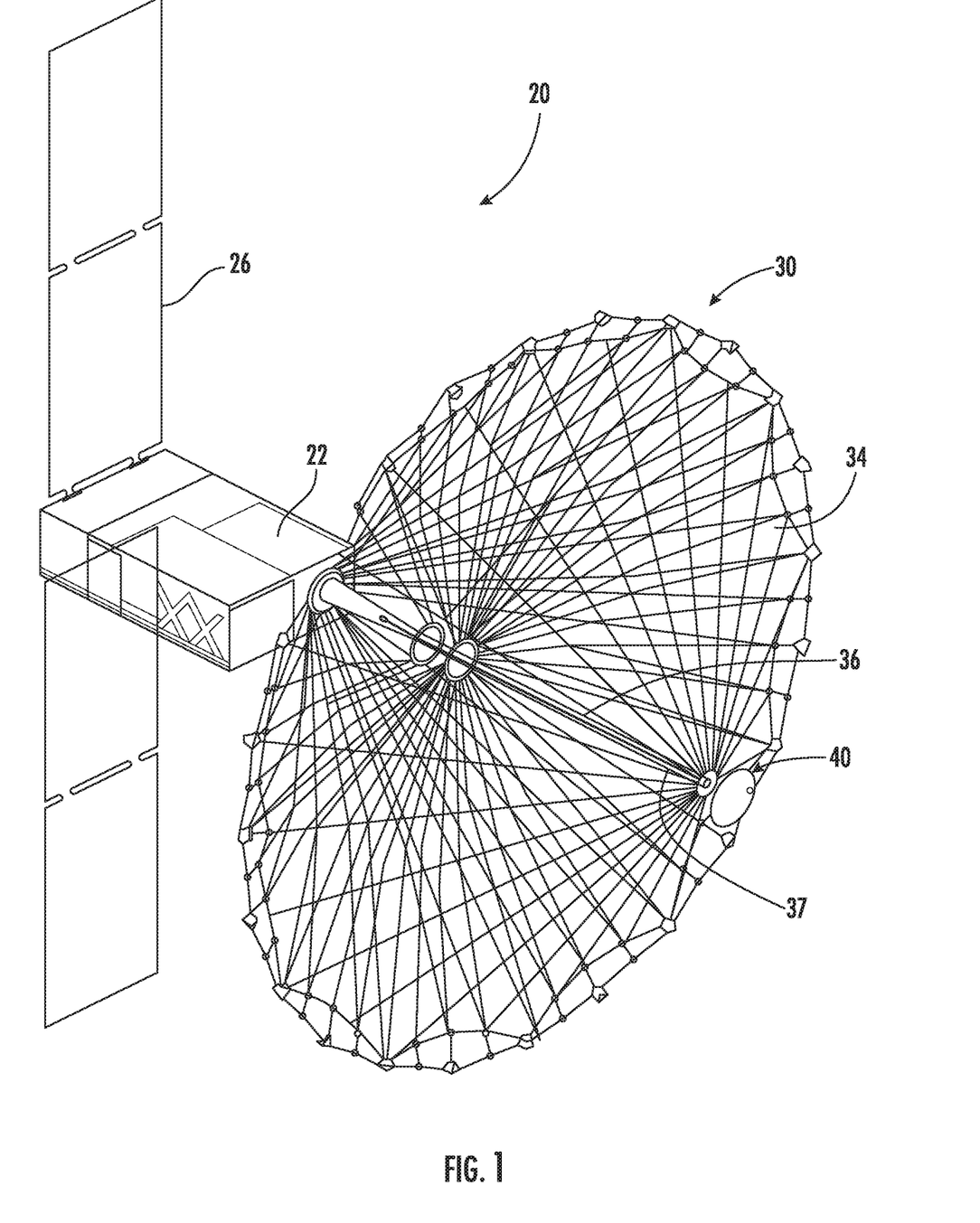
FIG. 1 is a perspective view of the satellite system showing the reflector and mast, and the radio frequency (RF) assembly and subreflector carried at a distal end of the mast.

Referring initially to FIG. 1, a satellite system is illustrated generally at 20 that usually will orbit Earth in a Low Earth Orbit (LEO) as typical for small satellites, although any orbit altitude may be established depending on satellite functions. The satellite system 20 includes a satellite enclosure 22 that carries electronics such as a satellite transceiver and solar panels 26. The satellite system 20 in this example is a small form factor satellite. The satellite transceiver and any associated electronic components and circuits may be formed from conventional off-the-shelf (COTS) components as is typical for those smaller satellites formed from Cube-Sats.

The satellite system 20 includes an antenna 30 having a reflector 34 carried by the satellite enclosure 22 and a mast 36 extending outwardly from the reflector as shown in the deployed condition of the antenna 30 in FIG. 1. A radio frequency (RF) assembly 40 is carried by the distal end of the mast 36 as shown in greater detail in FIG. 2, where the reflector 34 and mast 36 are shown in the stowed condition before being deployed when the satellite system 20 reaches the desired orbit. The RF assembly 40 includes a conductive waveguide body indicated generally at 42 that is received within the end of the mast 36. In this example, the conductive waveguide body 42 has a substantially cylindrically configured end 43 that is received inside the end of the mast 36, which includes a passageway 37 (FIG. 6) therein. In this example, the mast 36 is hollow and has about a 0.625 inch inner diameter at its end, such that one end of the conductive waveguide body 42 is received within the end of the mast. This conductive waveguide body 42 has an RF cavity 44 that is best shown in the sectional view of FIG. 6 and a pin-receiving opening 46 communicating with the RF cavity. The RF cavity 44 is coupled with the reflector 34, and in this example, designed to operate in the Ka-band, i.e., about 26 to 40 GHz.

Figure 5:
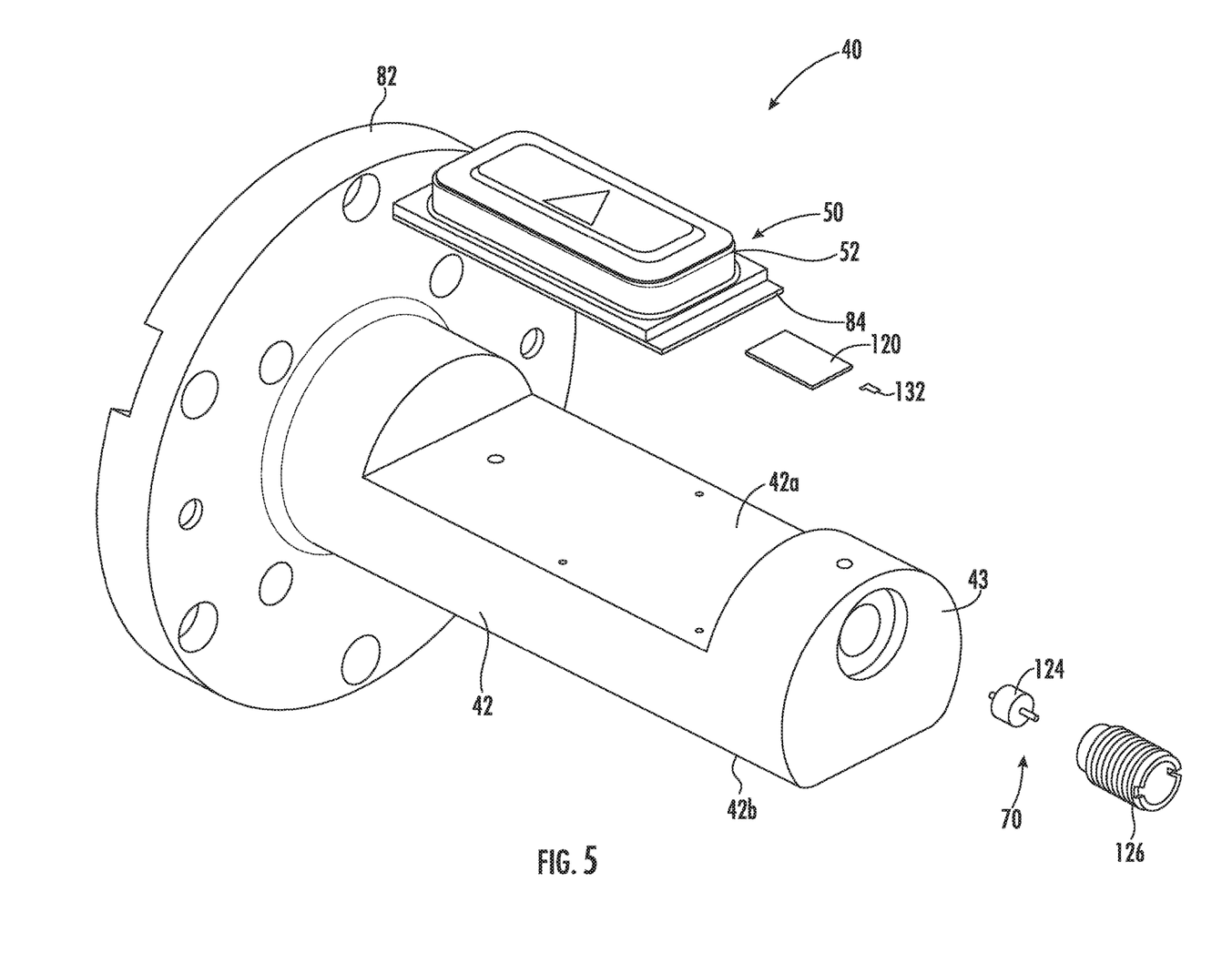
FIG. 5 is a partially exploded, rear perspective view of the RF assembly of FIG. 4 showing the RF circuit module.
Figure 9:
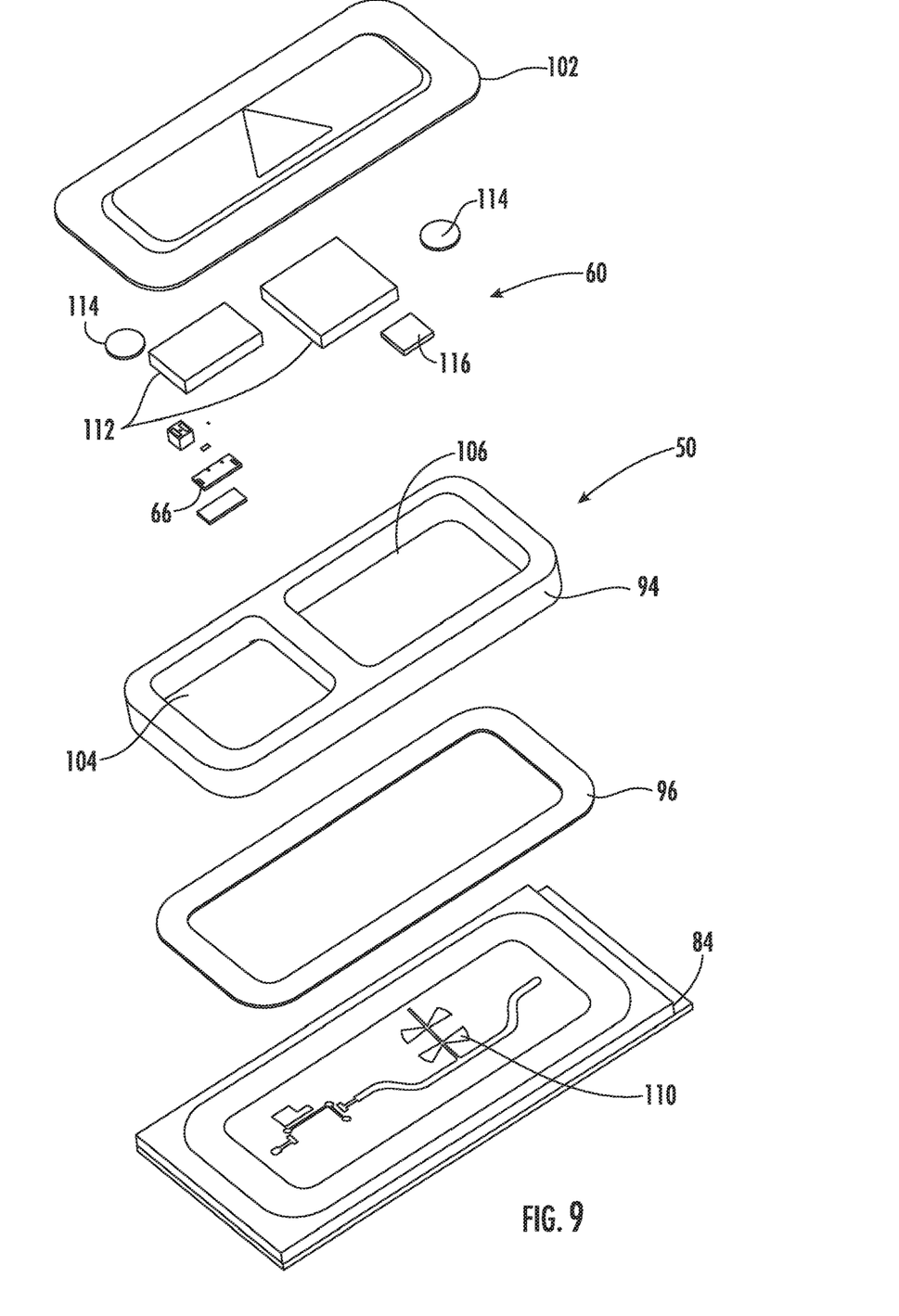
FIG. 9 is an exploded isometric view of the RF circuit module of FIG. 5.

The RF assembly 40 includes an RF circuit module indicated generally at 50 having a housing 52 (FIG. 3) that is hermetically sealed and carried by the conductive waveguide body 42 within a planar cut-out 42a formed at a portion of the cylindrically configured end 43 of the conductive waveguide body 42 (FIG. 5). RF circuitry 60 is contained within the housing 52 (FIGS. 6, 7 and 9) and a signal coupling pin 62 is coupled to the RF circuitry 60 and extends outwardly from the housing 52 and through the pin-receiving opening 46 into the RF cavity 44 to allow the RF signals to be routed from the RF cavity 44 into the RF circuitry when the reflector 34 and mast 36 are deployed to their fullest extent and operational. The RF circuitry 60 may include an RF signal amplifier 66 (FIG. 7), which in one example, is an integrated circuit Low Noise Amplifier (LNA). An RF cable connector 70 is carried by the conductive waveguide body 42 and coupled to the RF circuitry 60. A cable 72 is coupled to the RF cable connector 70 and extends through the passageway 37 in the mast 36 with the cable shown diagrammatically extending into and through the mast in FIG. 6.

Figure 3:
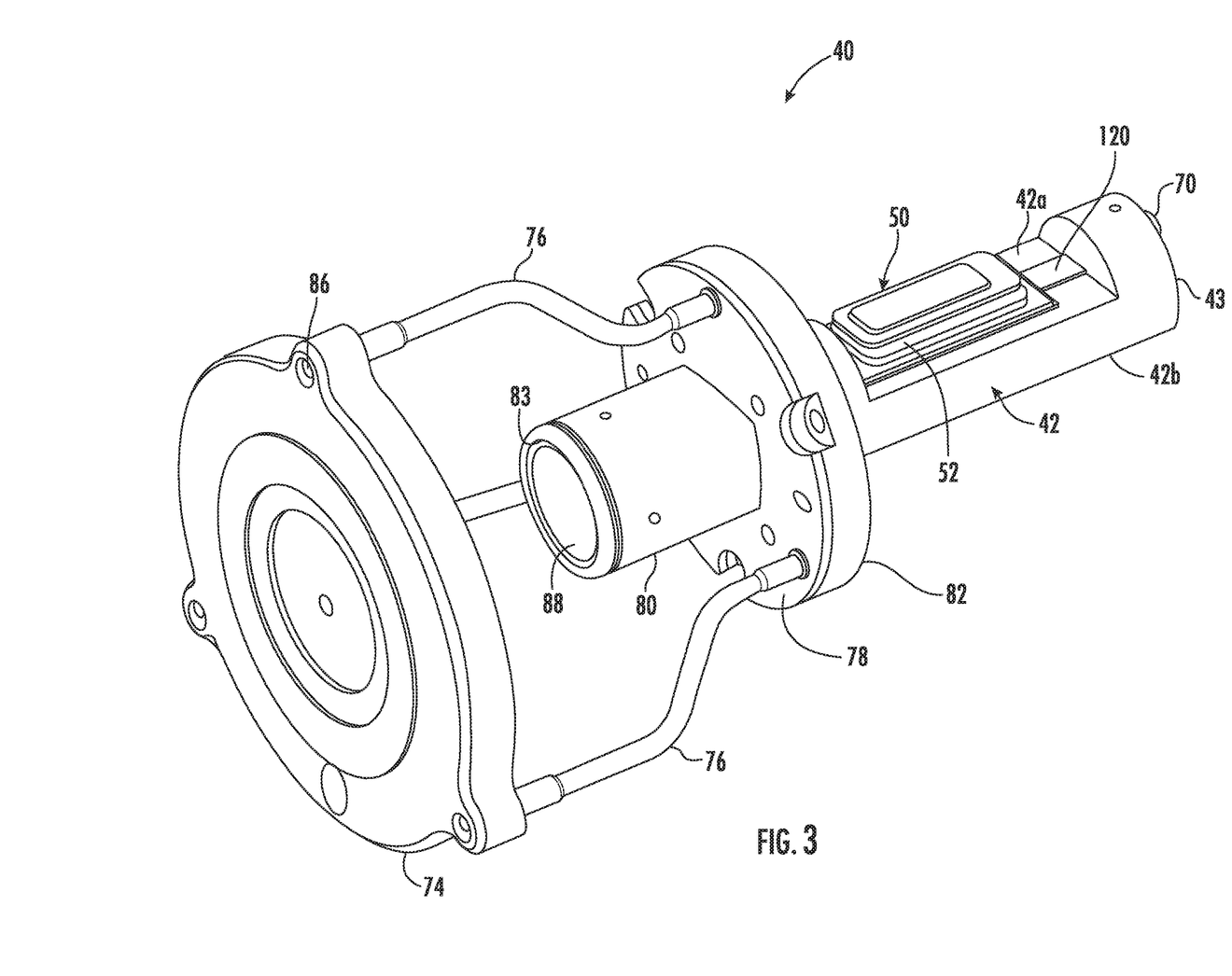
FIG. 3 is a front perspective view of the RF assembly and subreflector of FIG. 2.
Figure 4:
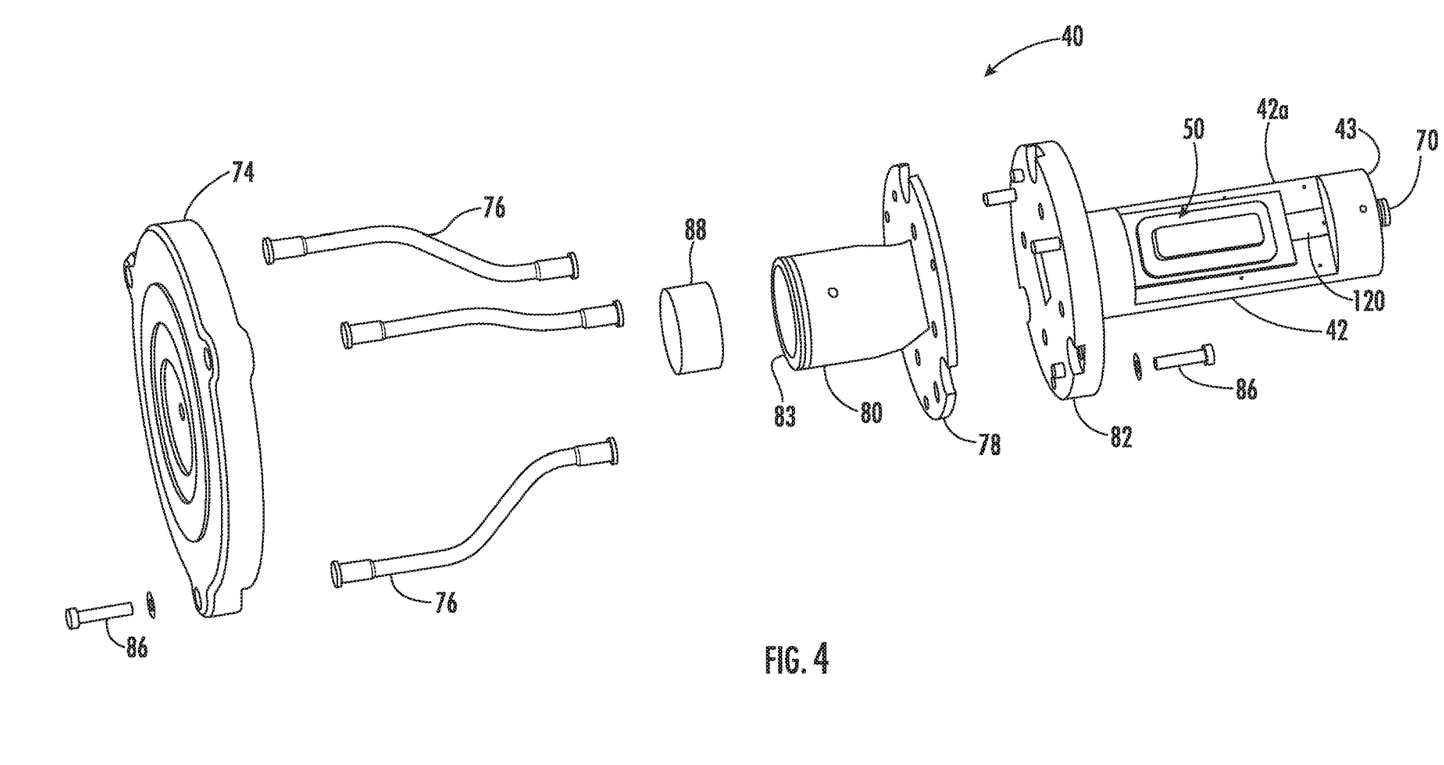
FIG. 4 is an exploded isometric view of the RF assembly and subreflector of FIG. 3.

As best illustrated in FIGS. 3 and 4, a subreflector 74 is carried by the distal end of the mast 36 and aligned with the reflector 34 and RF assembly 40, and in the illustrated example, is secured by three mounting spars 76 that are secured to both the subreflector and a first circular mounting flange 78 of a cylindrical horn 80 that is coupled to a second circular mounting flange 82 at the end of the conductive waveguide body 42. The horn 80 includes a circular opening 83 that is directed toward the subreflector 74 (FIG. 4).

In an example, the cylindrically configured end 43 of the conductive waveguide body 42 includes a flattened side 42b (FIG. 5) opposite the planar cut-out 42a, helping to reduce unnecessary weight and facilitating insertion of the conductive waveguide body into the end opening of the mast 36. The conductive waveguide body 42 may be formed from a low expansion and strong metallic material, such as Kovar, i.e., a nickel-cobalt ferrous alloy having a similar coefficient of thermal expansion (CTE) characteristic as borosilicate glass. Kovar is advantageous because the RF circuit module 50 may include a multilayer, low temperature co-fired ceramic (LTCC) substrate 84 (FIGS. 7-9), for example, formed from nine different tape layers about 0.038 inches thick. An example LTCC substrate 84 is GreenTape™ 9K7 LTCC as a low loss ceramic dielectric tape from Dupont. This LTCC substrate 84 may have a coefficient of thermal expansion ratio to make it operable with the Kovar material, which is advantageous in deep space applications where sunlight may warm up materials and later deep cold space itself will cool the heated material, thus creating extreme temperature variations and changes in dimensions of the different components because of the extreme swings in temperature.

Figure 2:
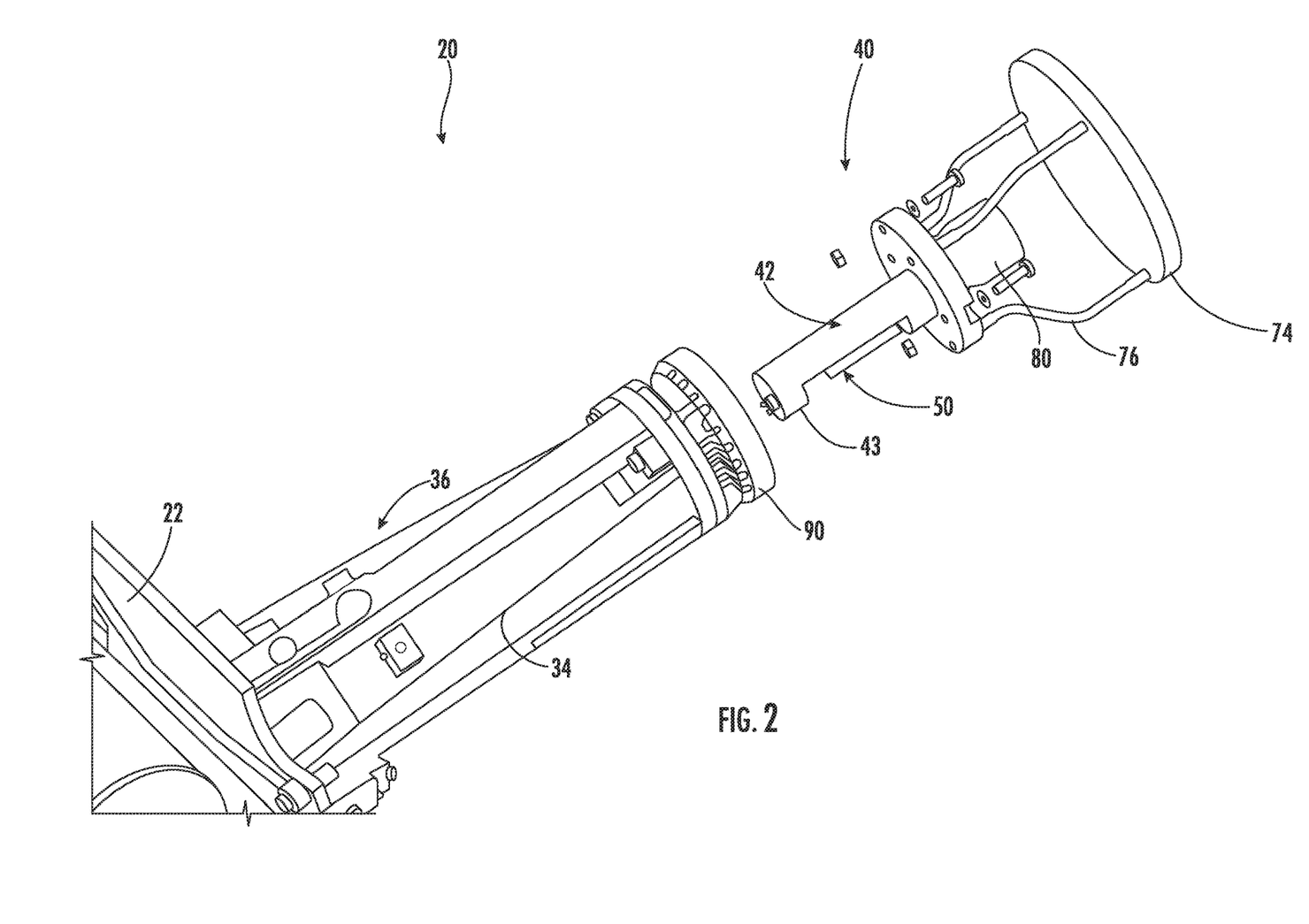
FIG. 2 is an enlarged perspective and partially exploded view of the RF assembly, and the mast and reflector of FIG. 1 in the stowed configuration.

In an example, the subreflector 74 is circular configured as illustrated in FIGS. 2-4 and formed of a metallic material, such as 6AL-4V Titanium Tiodized, Type II material. The mounting spars 76 are formed of a similar coated Titanium material as the subreflector 74 and connected to the subreflector by cruciform screws 86 that pass through the subreflector and into the end of the spars and are bent inward to attach to the smaller diameter first mounting flange 78 on the circular horn 80 forming an aperture and attached by cruciform screws 86 that pass through the first and second circular mounting flanges 78,82 and into the end of the mounting spars 76. The horn 80 may also be formed of similar material such as 6AL-4V Titanium Tiodized, Type II material. This material is a coated titanium using an electrolytic process in an alkaline bath and provides a better surface for space applications as in satellites. Each spar 76 in an example could be formed from the 0.080 inch diameter rod material, imparting sufficient mounting strength for the subreflector 74.

The conductive waveguide body 42 includes its second circular mounting flange 82 having a substantially similar diameter as the first circular mounting flange 78 on the circular horn 80 and both mounting flanges are secured to each other by the cruciform screws 86 (FIG. 4), e.g., Number 0-80 NAS 1101E00, as a non-limiting example. The circular horn 80 may include a cylindrically configured meander line polarizer 88 received within the circular horn opening 83 that may operate as a passive broadband polarizing device to convert polarization properties of RF wave and permit, for example, a linear polarized antenna to propagate circular polarization without variations in pattern performance. In an example, the polarizer 88 may be formed from several printed circuit sheets with etched-copper meander lines with sheets spaced about one-quarter wavelength apart to effect conversion between linear and circular polarization. The second circular mounting flange 82 of the conductive waveguide body 42 is connected onto a third circular mounting flange 90 positioned at the end of the mast 36 (FIG. 2) and retained by appropriate fasteners, such as offset cruciform screws 86 similar used for securing together first and second circular mounting flanges 78,82.

Figure 6:
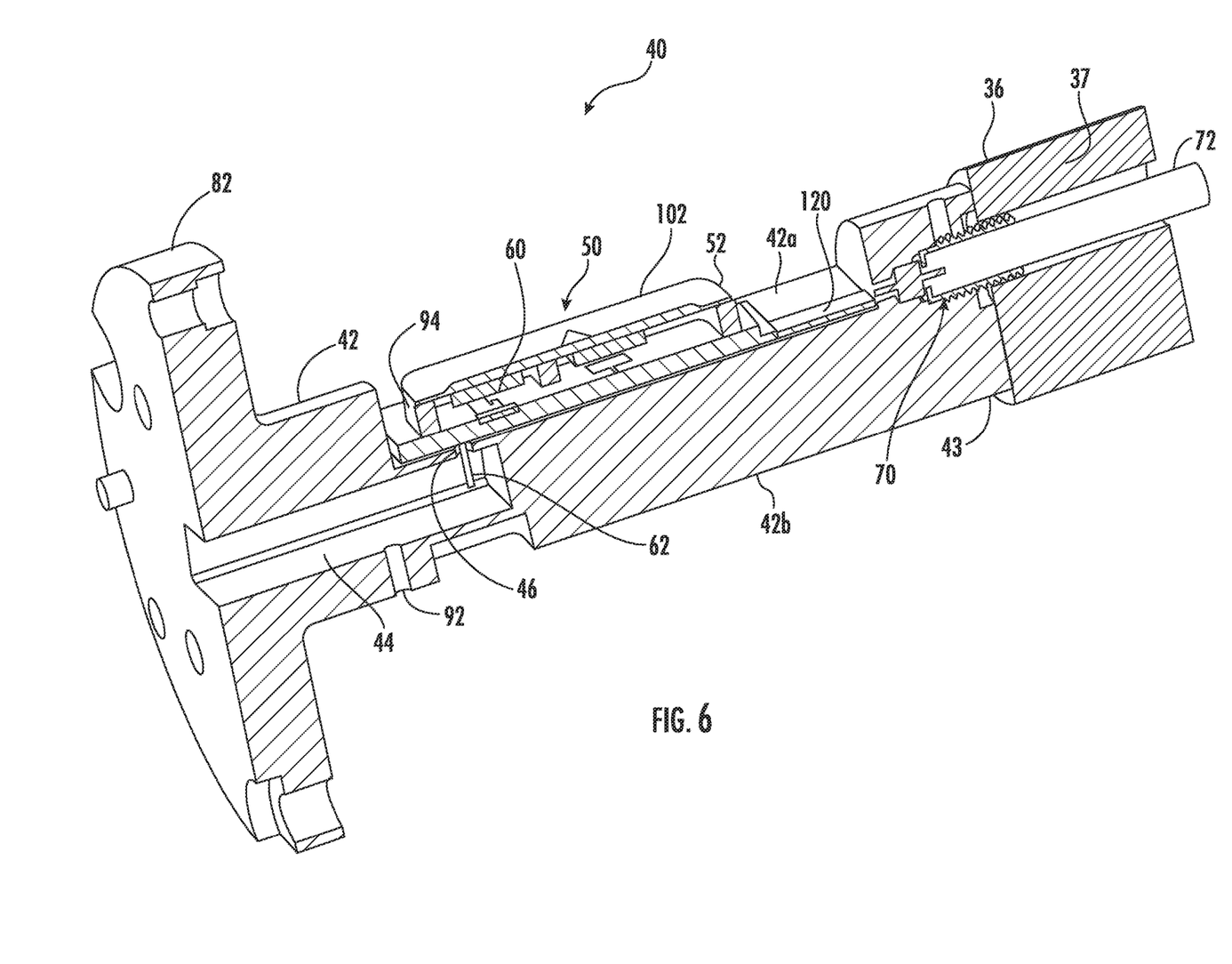
FIG. 6 is a sectional view of the RF assembly of FIG. 3.
Figure 7:
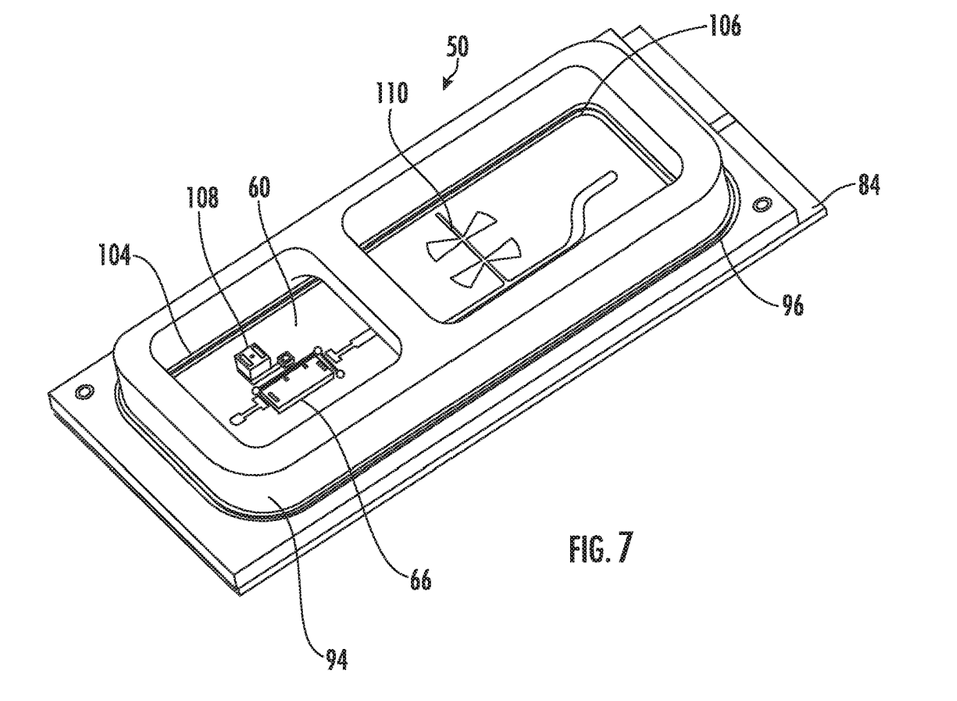
FIG. 7 is a partial perspective view of the RF circuit module of FIG. 5.

Referring now to FIGS. 5-9, there are illustrated further details of the RF assembly 40 that includes the conductive waveguide body 42 supporting the RF circuit module 50. As noted before, the RF circuit module 50 includes RF circuitry 60 contained within its housing 52, and the signal coupling pin 62 is coupled to the RF circuitry and extends outwardly from the housing and through the pin-receiving opening 46 into the RF cavity 44 as best shown in FIG. 6. The signal coupling pin 62, in an example, is formed as a 0.01 inch diameter Kovar waveguide pin that is received into the pin receiving opening 46, which in an example, is about a 0.034 inch diameter hole (FIG. 5) extending from the planar cut-out 42*a* into the RF cavity 44. The conductive waveguide body 42 has its RF cavity 44 coupled with the reflector 34, and the conductive waveguide body may include a vent hole 92 that is about 0.029 inches diameter as a non-limiting example.

Figure 8:
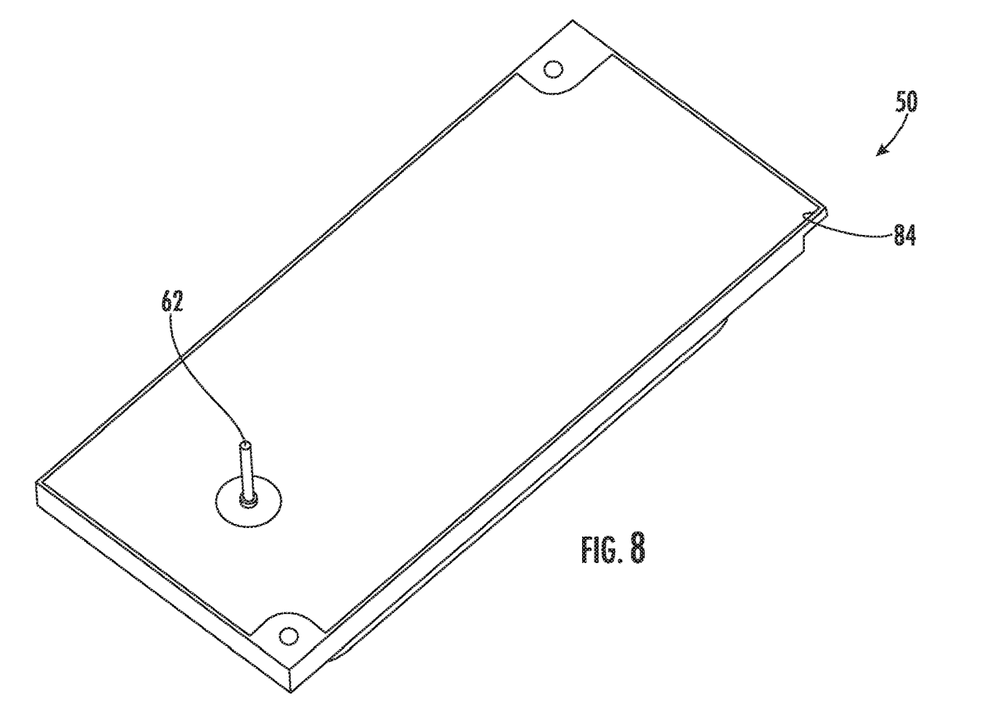
FIG. 8 is a bottom perspective view of the RF circuit module of FIG. 5 showing the signal coupling pin that couples to the RF circuitry.

The RF circuit module 50 supports RF circuitry 60 having an RF signal amplifier 66 as an integrated circuit Low Noise Amplifier (LNA) and mounted on the LTCC substrate 84, forming an LNA hybrid. As best shown in FIG. 8, the signal coupling pin 62 in an example is brazed by 80 Au-20Sn gold-tin solder to the back side of the LTCC substrate 84. The signal coupling pin 62 in an example is about 0.01 inch diameter and about 0.095 inches long, and configured to extend into the RF cavity 44 and operate in Ka-band. The signal coupling pin 62 extends from the rear or bottom side of the LTCC substrate 84 and extends through the pin-receiving opening 46 into the RF cavity 44 a substantial amount without touching the bottom side of the RF cavity.

The RF circuit module 50 includes a Kovar seal ring 94 (FIG. 9) received on an 80 Au-20Sn gold-tin preform 96 that is about 0.0025 inches thick, in one example. The RF module is closed and hermetically sealed by a Kovar lid 102. The Kovar seal ring 94 includes a central dividing wall forming first and second substrate cavities 104,106 (FIG. 7), with the first cavity including the Low Noise Amplifier 66 mounted on the LTCC substrate 84 and connected to circuit traces formed on the LTCC substrate. The signal coupling pin 62 is connected to the Low Noise Amplifier 66 via the circuitry formed in the different tape layers of the LTCC substrate and extends from the rear side of the LTCC substrate 84. The first cavity 104 includes DC bias capacitors 108 (FIG. 7) and the second cavity 106 may include a printed bias T-circuit 110 that operates as a diplexer, in an example, and may help set the bias levels and aid in passing RF signals, but blocking bias levels. As best shown in the exploded isometric view in FIG. 9, the first cavity 104 may also include an RF absorber 112 to absorb extraneous RF waves, and one or both substrate cavities 104,106 may include a particle getter 114 that operates as a reactive material inside the hermetically sealed housing 52 to help maintain vacuum and react with any foreign particles that might remain inside the RF circuit module 50 during manufacturing. One or more of the substrate cavities 104,106 may also include a hydrogen getter 116, for example, to control and reduce residual amounts of hydrogen and gas inside the sealed RF circuit module 50 if any gaseous particles are left over from manufacturing or somehow leak into the RF circuit module.

The low temperature co-fired ceramic (LTCC) substrate 84 is received on the planar cut-out 42*a* formed on the conductive waveguide body 42. In an example, the circuitry on the LTCC substrate 84 connects to a quartz launch substrate 120 (FIGS. 3-6) that is about 0.012 inches thick. In an example, a flea clip 132 (FIG. 5) attaches to the RF cable connector 70, which in this example, could include a brazed-in feedthrough 124 and a smooth bore threaded shroud 126 configured to connect to the RF cable 72. An example of the threaded shroud 126 is a cylindrical smooth bore threaded shroud, such as part number MSSS-11639 manufactured by Micro-Mode as a micro cable connector.

The RF assembly 40 forms a Ka-band feed assembly and is operative as a waveguide fed hybrid microcircuit. The signal coupling pin 62 is operative to transition a waveguide fed signal to a microstrip launch as part of the LTCC substrate 84 and the quartz launch substrate 120 connected to the RF circuit module 50. The mechanical form factor and micro interconnect, e.g., the RF cable connector 70, allows the conductive waveguide body 42 to fit inside the end opening of the small, deployable composite mast 36, which in an example, is about 0.625 inches in diameter. The radio frequency and amplifier bias voltage may be routed to different feed electronics contained within the satellite system 20 on one 0.047 inch diameter coaxial cable 72 with the aid of the printed bias T-circuit 110 (FIGS. 7 and 9), which minimizes the quantity and diameter of cables that have to be deployed within the mast 36. Multiple hybrid circuit designs can be used for different customer applications with no change necessary to the mast or waveguide structure such as the reflector 34, mast 36, horn 80, or subreflector 74.

The satellite system 20 that includes the reflector 34, mast 36, and RF assembly 40 as described provides a competitive advantage in the small satellite market of CubeSats and enables wideband communications in smaller volume packages that are inexpensive to launch and may be used with different deployable antennas. The satellite system 20 may be used in remote sensing applications similar to Hawkeye 360 systems and in voice, machine-to-machine, and high data rate communications.

Figure 10:
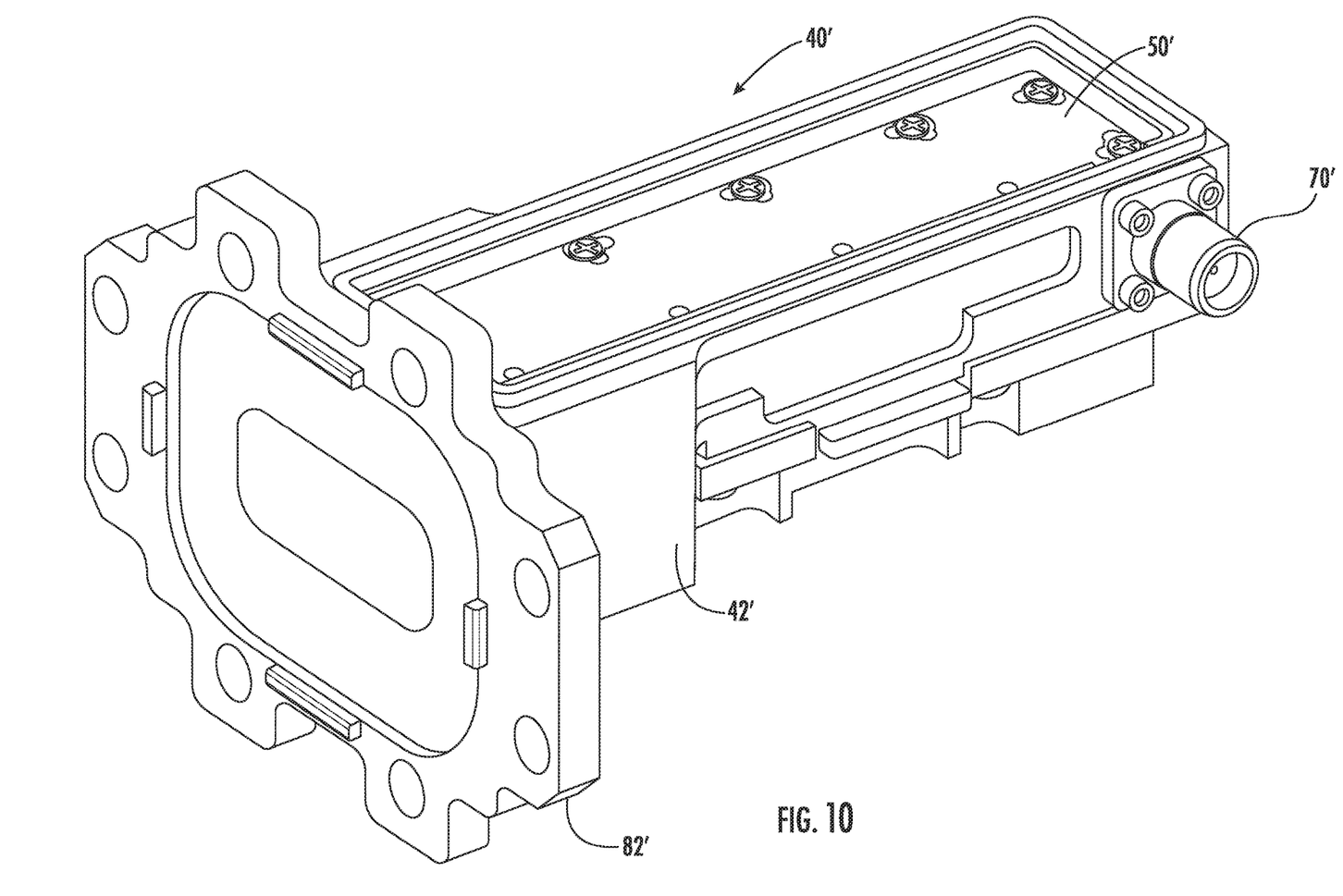
FIG. 10 is a perspective view of a second embodiment of the RF assembly where the RF circuitry operates as an RF signal limiter.
Figure 11:
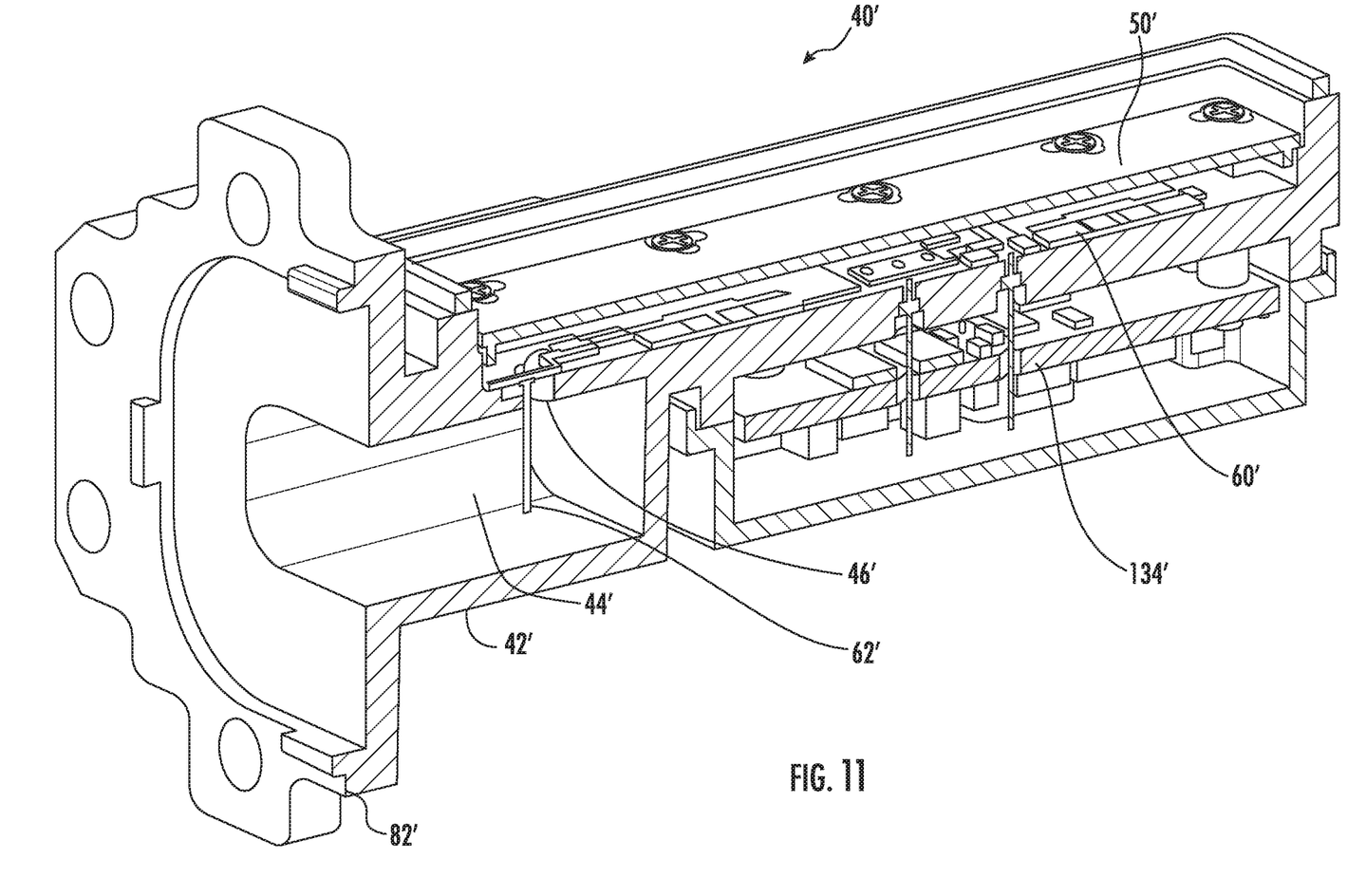
FIG. 11 is a sectional view of the RF assembly of FIG. 10.
Figure 12:
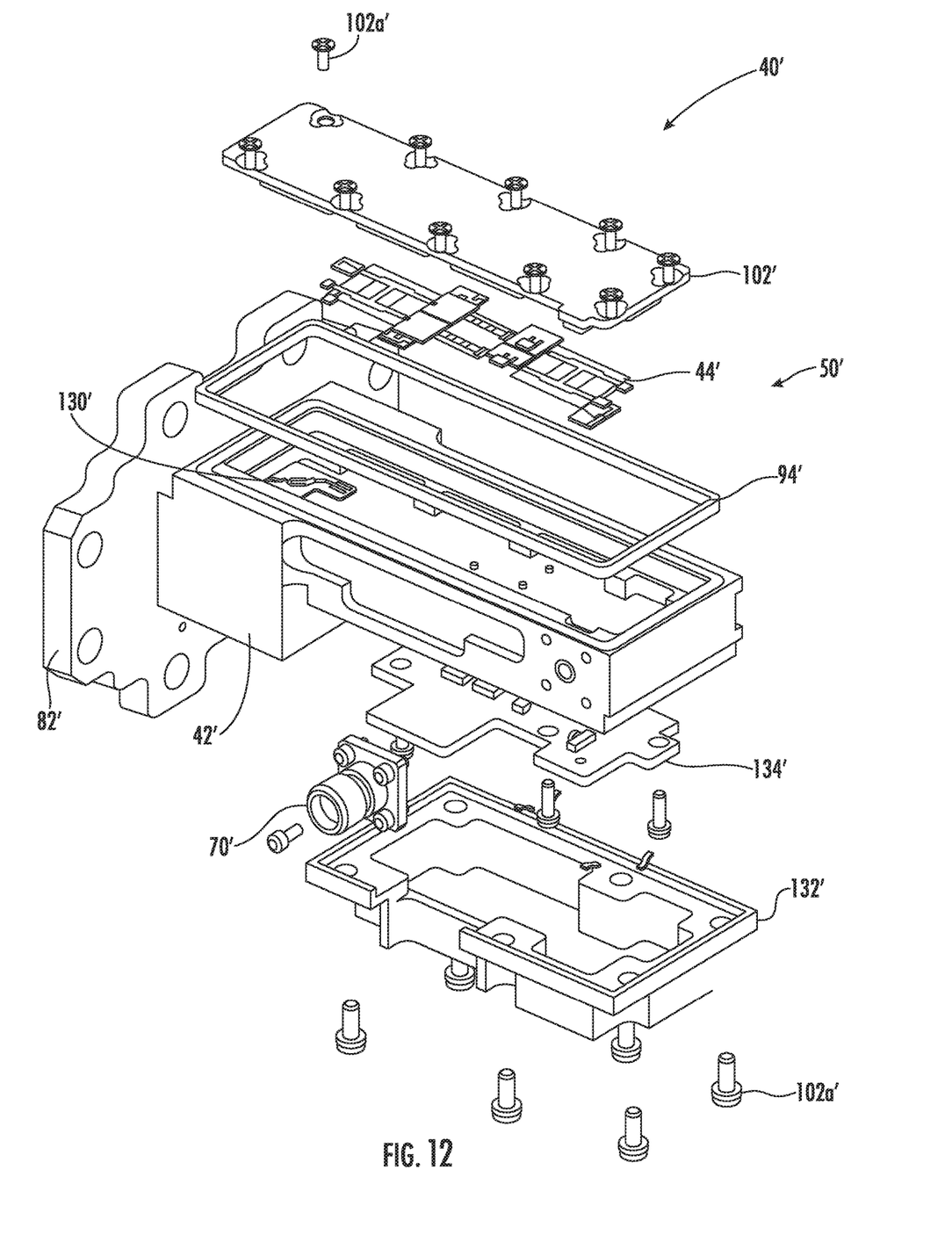
FIG. 12 is an exploded isometric view of the RF assembly of FIG. 10.

Different RF frequencies may be applied with some change to the waveguide structure geometry and the signal coupling pin 62', for example, shown in a second embodiment of FIGS. 10-12, where the RF circuitry 60' is formed of an RF signal limiter and some modifications are made for operation in the high-power X-band of about 8.0 to 12.0 GHz. In this second embodiment illustrated in FIGS. 10-12, prime notation is used throughout the description and common components between the first embodiment shown in FIGS. 1-9 are given the same reference numeral but in prime notation.

As illustrated, an RF assembly 40' includes its conductive waveguide body 42' having an RF cavity 44' (FIG. 11) that is coupled with a reflector (not shown) and having a pin-receiving opening 46' therein. The RF circuit module 50' has a different configuration with RF circuitry 60' operative in the X-band at 8.0 to 12.0 GHz. The conductive waveguide body 42' includes an integral waveguide flange 82' corresponding to the second circular mounting flange 82 of the first embodiment. The signal coupling pin 62' in this second embodiment is also formed from Kovar and is about 0.02 inches in diameter to operate in the X-band. The RF cable connector 70' in this example may be formed as an SMA connector and the conductive waveguide body 42' may be formed from copper-molybdenum (Cu—Mo) material. The conductive waveguide body 42' may include a rectangular configured end 43' forming part of the RF circuit module 50' as a housing 52' and carries the RF cable connector 70' and a Kovar seal ring 94' and Kovar cover as a lid 102' that may be connected by fasteners such as screws 102a'. In an example, the RF circuitry 44' is operatively connected to a brazed-in probe substrate 130' that receives the signal coupling pin 62'.

The lower portion of the conductive waveguide body 42' may include a closeout cover 132' as an electromagnetic interference (EMI) shield secured by screws 102' that also protects a DC circuit card assembly (CCA) 134' to form a dual sided conductive waveguide body having RF and DC sides. The RF side containing the RF circuitry 60' may be hermetically sealed for use with an open die as an example and the DC side may contain all necessary DC power and control functionality via the attached circuit card assembly 134' and cable connector 70'.

The waveguide mounting flange 82' is integrated with the conductive waveguide body 42' and allows for direct interconnection to waveguide components without the requirement for a waveguide coaxial transition or connectorized cable. The integrated waveguide flange 82' also allows for high-power applications where loss due to connectors and cables cannot be tolerated and it also provides a resilient and compact interface. The RF assembly 40' is formed of high conductivity, low CTE material to provide thermal management and mounting of high-power dissipating components as used in many high RF power applications. The RF circuit 60' may include amplifiers and similar components as in the first embodiment.

Figure 13:
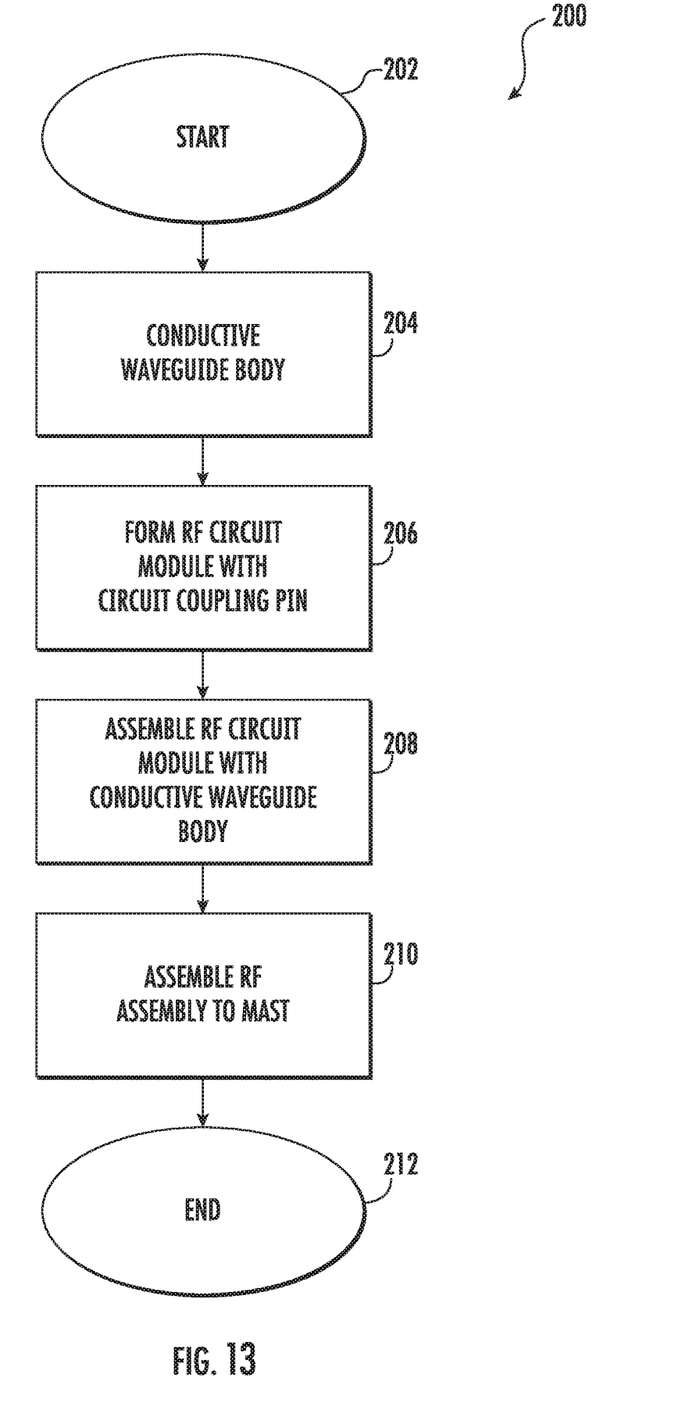
FIG. 13 is a high-level flowchart of a method of making the satellite system.

Different manufacturing techniques may be used and in an example shown in the high-level flowchart of FIG. 13, a method for making the RF assembly for the satellite system with the reflector is illustrated generally at 200. The process starts (Block 202) and a conductive waveguide body 42 is formed (Block 204). The RF circuit module 50 having the signal coupling pin 62 is formed (Block 206). The RF circuit module 50 is assembled with the conductive waveguide body 42 to form the RF assembly 40 (Block 208). The RF assembly 40 is assembled to the mast 36 carried by the reflector 34 (Block 210). The process ends (Block 212).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A satellite system comprising:
   a reflector;
   a mast extending outwardly from the reflector; and
   a radio frequency (RF) assembly carried by a distal end of the mast, the RF assembly comprising
      a conductive waveguide body having an RF cavity therein coupled with the reflector, and having a pin-receiving opening therein, and
      an RF circuit module comprising a housing carried by the conductive waveguide body, RF circuitry contained within the housing, and a signal coupling pin coupled to the RF circuitry and extending through the pin-receiving opening into the RF cavity.

2. The satellite system of claim 1 wherein the housing comprises a hermetically sealed housing.

3. The satellite system of claim 1 wherein the RF circuitry comprises an RF signal amplifier.

4. The satellite system of claim 3 wherein the RF signal amplifier comprises an integrated circuit Low Noise Amplifier (LNA).

5. The satellite system of claim 1 wherein the RF assembly comprises an RF cable connector carried by the conductive waveguide body and coupled to the RF circuitry.

6. The satellite system of claim 5 wherein the mast has a passageway therein; and comprising a cable coupled to the RF cable connector and extending through the passageway.

7. The satellite system of claim 1 comprising a subreflector carried by the distal end of the mast and aligned between the reflector and the RF assembly.

8. The satellite system of claim 7 comprising a horn coupled to the conductive waveguide body and directed toward the subreflector.

9. A radio frequency (RF) assembly for a satellite system including a reflector, the RF assembly comprising:
   a conductive waveguide body having an RF cavity therein to be coupled with the reflector, and having a pin-receiving opening therein; and
   an RF circuit module comprising a housing carried by the conductive waveguide body, RF circuitry contained within the housing, and a signal coupling pin coupled to the RF circuitry and extending through the pin-receiving opening into the RF cavity.

10. The RF assembly of claim 9 wherein the housing comprises a hermetically sealed housing.

11. The RF assembly of claim 9 wherein the RF circuitry comprises an RF signal amplifier.

12. The RF assembly of claim 11 wherein the RF signal amplifier comprises an integrated circuit Low Noise Amplifier (LNA).

13. The RF assembly of claim 9 wherein the RF circuitry comprises an RF signal limiter.

14. The RF assembly of claim 9 wherein the RF assembly comprises an RF cable connector carried by the conductive waveguide body and coupled to the RF circuitry.

15. A method for making a radio frequency (RF) assembly for a satellite system including a reflector, the method comprising:
   forming a conductive waveguide body having an RF cavity therein to be coupled with the reflector, and having a pin-receiving opening therein; and
   coupling an RF circuit module to the conductive waveguide body, the RF circuit module comprising a housing carried by the conductive waveguide body, RF circuitry contained within the housing, and a signal coupling pin coupled to the RF circuitry and extending through the pin-receiving opening into the RF cavity.

16. The method of claim 15 wherein the housing comprises a hermetically sealed housing.

17. The method of claim 15 wherein the RF circuitry comprises an RF signal amplifier.

18. The method of claim 17 wherein the RF signal amplifier comprises an integrated circuit Low Noise Amplifier (LNA).

19. The method of claim 15 wherein the RF circuitry comprises an RF signal limiter.

20. The method of claim 15 wherein the RF assembly comprises an RF cable connector carried by the conductive waveguide body and coupled to the RF circuitry.

* * * * *